US007340658B2

(12) United States Patent
Seuring

(10) Patent No.: US 7,340,658 B2
(45) Date of Patent: Mar. 4, 2008

(54) TECHNIQUE FOR COMBINING SCAN TEST AND MEMORY BUILT-IN SELF TEST

(75) Inventor: Markus Seuring, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 283 days.

(21) Appl. No.: 11/008,877

(22) Filed: Dec. 10, 2004

(65) Prior Publication Data

US 2005/0204232 A1 Sep. 15, 2005

(30) Foreign Application Priority Data

Feb. 27, 2004 (DE) .................... 10 2004 009 693

(51) Int. Cl.
*G01R 31/28* (2006.01)
*G11C 29/00* (2006.01)
*G11C 7/00* (2006.01)

(52) U.S. Cl. .................... 714/726; 714/718; 365/201
(58) Field of Classification Search ............... 714/718, 714/733
See application file for complete search history.

(56) References Cited

U.S. PATENT DOCUMENTS

| | | | | |
|---|---|---|---|---|
| 5,568,437 | A | 10/1996 | Jamal .................... | 365/201 |
| 5,761,215 | A * | 6/1998 | McCarthy et al. .......... | 714/726 |
| 6,415,403 | B1 * | 7/2002 | Huang et al. ............. | 714/726 |
| 6,560,740 | B1 * | 5/2003 | Zuraski et al. ........... | 714/733 |
| 6,681,359 | B1 | 1/2004 | Au et al. ................ | 714/733 |
| 2002/0138802 | A1 * | 9/2002 | Firth et al. .............. | 714/733 |
| 2004/0083412 | A1 * | 4/2004 | Corbin et al. ............. | 714/726 |
| 2004/0098643 | A1 * | 5/2004 | Schulz .................... | 714/718 |
| 2004/0190331 | A1 * | 9/2004 | Ross et al. ................ | 365/154 |
| 2005/0120284 | A1 * | 6/2005 | Ouellette et al. ........... | 714/718 |

FOREIGN PATENT DOCUMENTS

| | | |
|---|---|---|
| EP | 0 747 941 A2 | 12/1996 |
| EP | 1 122 771 A2 | 8/2001 |
| JP | 06102327 A * | 9/1992 |

OTHER PUBLICATIONS

"A scan-BIST environment for testing embedded memories" Karimi et al. 2002 IEEE International Workshop on Memory Technology, Design and Testing, 2002 Proceedings Publication Date: 2002 On pp. 17-23 ISSN: 1087-4852 ISBN: 0-7695-1617-3 INSPEC Accession No. 7425855.*

"A scan-BIST environment for testing embedded memories" by Karimi et al. This paper appears in: On-Line Testing Workshop, 2002. Proceedings of the Eighth IEEE International Publication Date: 2002 On pp. 211-217 ISBN: 0-7695-1641-6 INSPEC Accession No. 7425843.*

"Designing built-in self-test circuits for embedded memories test" by Park et al. This paper appears in: ASICs, 2000. AP-ASIC 2000. Proceedings of the Second IEEE Asia Pacific Conference on Publication Date: 2000 On pp. 315-318 ISBN: 0-7803-6470-8 INSPEC Acession No. 6866824.*

* cited by examiner

*Primary Examiner*—Cynthia Britt
(74) *Attorney, Agent, or Firm*—Williams, Morgan & Amerson

(57) ABSTRACT

Semiconductor devices including logic circuitry and embedded memories may be tested using one or more flip-flops in a scan chain that are connected to a control input of an MBIST logic, thereby allowing the control of the MBIST logic during a simultaneous scan test and memory test run. By combining the output of the MBIST logic with the output of the scan chain, fault diagnosis is maintained.

35 Claims, 3 Drawing Sheets

TECHNIQUE FOR COMBINING SCAN TEST AND MEMORY BUILT-IN SELF TEST

BACKGROUND OF THE INVENTION

1. Field of the Invention

The present invention generally relates to techniques for testing semiconductor devices, and, more particularly, to techniques for testing integrated circuits that include logic circuitry portions and embedded memory portions with respective scan chains and memory built-in self test logics connected thereto.

2. Description of the Related Art

In manufacturing semiconductor devices including a relatively complex circuitry, the testing of the device may represent a part of the manufacturing process, which is frequently under-estimated in terms of cost and effort required to obtain reliable data with respect to proper functionality and reliability of the device. One reason in failing to meet performance specifications of the integrated circuit may reside in design errors that may be identified and remedied by circuit verification on the basis of software simulation and/or prototype testing prior to mass production of the integrated circuits under consideration. An improper functionality of the integrated circuit may further be caused by the manufacturing process itself when the completed circuitry does not correspond to the verified circuit design owing to process fluctuations in one or more of a large number of process steps. Although measurement and test procedures are incorporated at many points in the manufacturing process, it is nevertheless extremely important to ascertain the correct functioning of the final semiconductor device, since, according to a common rule of thumb, the costs caused by defective chips increase with each assembly phase by approximately one order of magnitude. For example, the costs caused by a defective circuit board including a faulty chip are typically significantly higher than identifying a defective chip prior to shipping and assembling the circuit board. The same holds true for a system, when a failure thereof is caused by one or more defective circuit boards as a downtime of an industrial system may result in averaged costs of approximately several hundred dollars per minute compared to a price of a few dollars for an integrated circuit chip having caused the defect.

Hence, there is a vital interest in developing test procedures to identify as many defects as possible in completed integrated circuits while not unduly increasing the total manufacturing costs. In particular, with the demand for more features and lower costs of circuits, there is a tendency to integrate a plurality of different circuit portions into a single chip to provide a complete system on a chip (SOC). A semiconductor device comprising various functional blocks may typically include, in addition to one or more logic blocks, one or more embedded memory portions, such as are used as on-chip cache for CPUs or as buffers for data packets that are transferred between different clock domains.

As discussed above, economic constraints force semiconductor manufacturers to not only minimize the defect level of the total manufacturing process, but also to provide, in combination with a reduced defect level, a high fault coverage to reduce the delivery of defective chips at reasonable cost for appropriate test procedures and techniques. For moderately complex integrated circuits, it has become standard practice to develop the basic design of the circuit while taking into consideration a plurality of constraints posed by effective test procedures. Moreover, typically additional hardware resources are provided in the chip that may enable the identification of faulty circuit components for a broad class of operating conditions, wherein the additional hardware resources in combination with design specifics of the basic circuit and sophisticated test procedures and test patterns substantially determine the fault coverage of the test procedure.

In many circuit designs, the functional logic portion is tested by so-called scan chains, which represent a chain of flip-flops connected to a specific area of the functional logic in such a way that the functional logic or a specific area thereof may be initialized with a desired state that has previously been entered into the scan chain. Moreover, upon providing one or more clock signals to the functional logic, the state thereof, that is the state of each logic gate connected to a dedicated flip-flop of the scan chain, may then be stored in the scan chain and may be shifted out by supplying respective shift clock signals to the scan chain. Depending on the bit pattern or input vector entered into the scan chain for initializing the functional logic, corresponding faulty logic gates may be identified. However, the fault coverage, i.e., the potential for identifying any error within the functional logic, significantly depends on the design, selection and number of appropriate scan chains and suitable input vectors. In principle, such scan test techniques may also be modified to include the testing of memory portions, wherein, however, only for small memories, appropriate scan test patterns, i.e., the number and size of appropriate input vectors, may exhibit a size that allows the testing of memory portions within acceptable time intervals.

For this reason, frequently a so-called memory built-in self test (MBIST) logic is provided as an additional hardware resource within a chip, to implement a memory test procedure requiring fewer clock cycles and supporting the testing of important extended fault models that are specific to memories. With reference to FIGS. 1a and 1b, the configuration and the test procedures for a representative conventional semiconductor device including functional logic and a memory portion are described in more detail to more clearly illustrate the problems involved.

FIG. 1a schematically shows a circuit diagram of a semiconductor device 100 including a functional logic circuitry 110, which may be connected to a memory portion 120 via write lines, read lines and control lines that are commonly referred to as lines 121. The device 100 further comprises a scan chain 140 connected to the logic circuitry 110, wherein, as previously discussed, the scan chain 140 may include a plurality of flip-flops, which are connected to the logic circuitry 110 such that dedicated logic gates may be initialized by the scan chain and resulting states of the dedicated logic gates, after one or more clock cycles for operating the logic 110, may be stored in and retrieved from the scan chain 140 at an output 141 thereof. The device 100 further comprises an MBIST logic 130 including, for instance, a finite state machine 131 for implementing a desired algorithm for testing the memory portion 120. The MBIST logic 130 further comprises all components required for disconnecting the memory portion 120 from the functional logic 110 to enable the operation of the memory portion 120 fully under control of the MBIST logic 130 when operating the logic 130 for the memory test.

On the other hand, when disabled, the MBIST logic 130 is "transparent" for the lines 121 to allow proper operation of the logic circuitry 110 in combination with the memory portion 120. The MBIST logic 130 comprises a first control input 132, which is also referred to as MBIST-start, and a second control input 133, also indicated in the drawing as MBIST-enable. Moreover, a first output 134, also referred to in the drawing as MBIST-good, and a second output 135, also indicated as MBIST-done, are provided in the MBIST logic 130. It should be noted that, for convenience, any additional inputs or outputs of the logic 130, such as clock inputs, reset inputs and other control lines, are not shown.

When operating the device 100 in a memory test mode, the MBIST logic 130 may be enabled by providing a corresponding signal at the input 133 (MBIST-enable) to disconnect the memory portion 120 from the surrounding logic circuitry 110. By supplying a corresponding signal at the input 132 (MBIST-start), the circuit portion 130 is started to generate address values and to write data into the memory portion 120. The circuit 130 may also include a comparator, which may be configured to check if the data written into the memory 120 may be correctly read back from the memory, and which may provide a corresponding value at the output 134 (MBIST-good). For instance, the value of the output 134 may remain at logic "1" as long as no error occurs in writing data into the memory 120 and reading back the data, while the output 134 may be reset to a logic "0" once an error is detected. After the test of the memory 120 is completed, a corresponding signal may be presented at the output 135 (MBIST-done), for instance, the output 135 may be switched from logic "0" to logic "1" if the test is completed.

As previously explained, incorporating the MBIST logic 130 provides more efficient testing of the memory 120, as would be obtained by testing the device 100 by modifying the scan chain 140 and the required scan patterns. After a successful memory test, the logic 110 may then be tested by initializing the logic 110 with a respective input vector applied to the scan chain 140 via the input 142, operating the logic 110, that is, scanning the logic 110 by supplying respective scan clock signals to the logic 110, and reading out the state of the scan chain after a predefined number of scan clock signals by correspondingly shifting out the states of the scan flip-flops while the operation of the logic 110, i.e., the scan clock signals, is interrupted. On the basis of the output vector sequentially obtained at the output 141, the functionality of logic 110 may be verified to a degree determined by the scan test algorithm and the configuration of the scan chain 140. Due to the configuration of the device 100, the scan test and the memory test have to be sequentially performed, thereby requiring a moderately high amount of test time. Furthermore, the scan test of the device 100 is not independent from the memory test, since, without having intensively verified the proper functionality of the memory 120, any fault detected by the scan test may not unambiguously be assigned to a faulty component in the logic circuitry 110. Moreover, the circuit portion 131 controlling the MBIST logic 130 and preferably all other flip-flops of the MBIST logic 130 may be included into the scan chain 140 to ensure the correct function of the logic 130 during the memory test. However, merely providing additional scan flip-flops for the MBIST logic 130 and incorporating these additional scan flip-flops into the scan chain 140 may significantly complicate the situation during testing of the device 100, as the scan test and the memory test mutually depend on each other. Therefore, it may be advantageous to add additional circuitry to form a bypass for the memory portion 120 during scanning of the logic 110 and the MBIST logic 130.

FIG. 1b schematically shows a circuit diagram illustrating, in principle, the semiconductor device 100 with a bypass logic 150 that offers an enhanced flexibility in performing scan tests and memory tests. The bypass logic 150 may provide a function that maps values of address, write and control lines to the values of the read lines of the memory portion 120. Advantageously, the implemented function supports fault propagation and allows the generation of all possible output values so that any logic components between the inputs and outputs of the memory portion 120 as well as the adjacent scan flip-flops can be readily tested. In other approaches, it has been suggested to emulate or surround the memory by scanable registers to provide more flexibility in scanning the logic 110 and testing the memory portion 120.

During the scan test, the MBIST logic 130 has to be disabled so that the MBIST logic 130 is "transparent," while the bypass logic 150 provides the correct functionality of the logic 110, thereby not requiring the operation of the memory portion 120. Thus, any faulty memory cells will not affect the result of the scan test. On the other hand, while a memory test is running, i.e., while the MBIST logic 130 is active, a scan test must be disabled to render the bypass logic 150 "transparent" to allow for an undisturbed test procedure of the memory cells in the memory portion 120.

Consequently, although the approaches described with reference to FIG. 1b provide an enhanced flexibility in performing scan tests and memory tests compared to the basic circuit design shown in FIG. 1a, there is still a significant effort to be made in performing reliable test procedures, as the scan test runs have to be carried out separately to the memory test runs. Moreover, the conventional technique as described with reference to FIGS. 1a and 1b may not be very efficient during stress tests in which a high switching activity is required in the combinatorial logic, i.e., the logic circuitry portion 110, while test data are written into and read out from the memory to verify a correct function of the memory during specified stress conditions.

In view of the problems identified above, there is a need for an improved technique that provides more efficient testing of semiconductor devices while maintaining the additional hardware and software overhead required for performing test procedures at a low level.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables simultaneous performance of a scan test of a logic circuitry portion and a memory test of an embedded memory, wherein, compared to a conventional semiconductor device, additional input lines and output lines for the test specific hardware resources on the chip may be avoided. To this end, the present invention is based on the concept that at least one scan flip-flop is selected for controlling, for instance for starting and stopping, an MBIST logic when the circuit is in the scan test mode. Hence, the time required for testing a specified circuitry may significantly be reduced, while advantageously the increased switching activity during the scan test mode provides high efficiency during stress tests, since test data is written into each memory cell and is read back again, while the high switching activity in the combinatorial logic portion of the circuitry still continues.

According to one illustrative embodiment of the present invention, a semiconductor device comprises a memory portion and a memory built-in self test (MBIST) logic connected to the memory portion, wherein the MBIST logic includes a control input for controlling a memory self test mode. Moreover, the semiconductor device comprises a logic circuitry portion and a scan chain connected to the logic circuitry portion, wherein the scan chain comprises a plurality of sequentially arranged flip-flops, a scan input and a scan output. Furthermore, an output of at least one of the plurality of flip-flops is connected to set the control input of the MBIST logic.

According to another illustrative embodiment of the present invention, a method comprises shifting an input vector into a scan chain that is connected to a logic circuit portion, wherein the input vector has at least one control bit for an associated flip-flop of the scan chain. Moreover, the controlling of a memory built-in self test (MBIST) of an MBIST logic, which is connected to a memory portion, is controlled on the basis of the at least one control bit.

BRIEF DESCRIPTION OF THE DRAWINGS

The invention may be understood by reference to the following description taken in conjunction with the accompanying drawings, in which like reference numerals identify like elements, and in which.

Figure 1A:
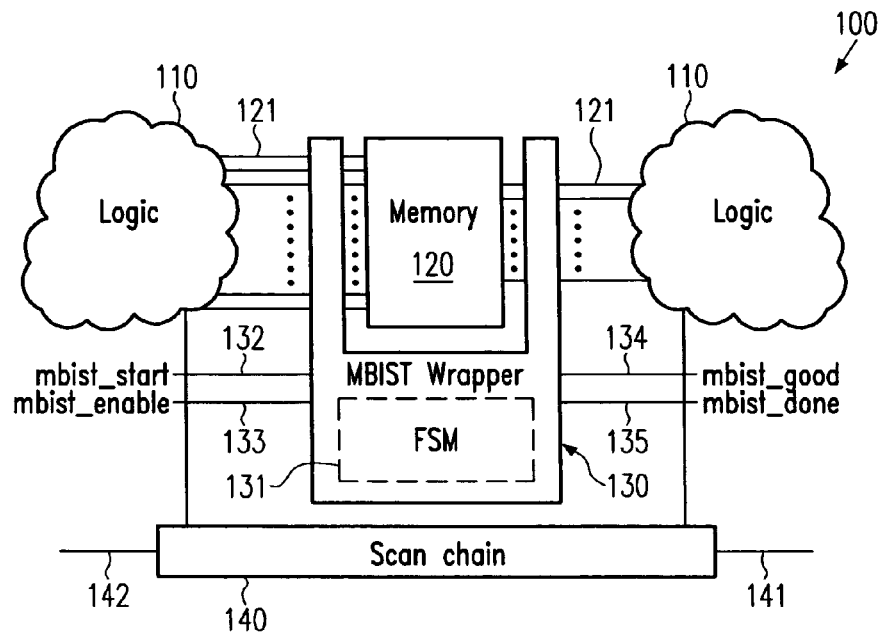
FIGS. 1a and 1b schematically show circuit diagrams of semiconductor devices including conventional prior art circuitry for a scan test mode and a memory test mode.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that a scan test for a combinatorial logic and a memory self test may be performed simultaneously during the scan phase, wherein the MBIST logic handling the memory test may be controlled by the state of a dedicated flip-flop within the scan chain of the combinatorial logic. For instance, for a given design of a semiconductor device including scan flip-flops and an MBIST logic, only minimal amendments of the design are required to provide the potential of a simultaneous scan test and memory test with the option of controllability of the memory test without requiring additional input lines and output lines. Consequently, well-established ATPG (automatic test pattern generating) tools may still be advantageously used to generate appropriate scan test patterns, thereby providing a high degree of compatibility with conventional approaches. With reference to FIGS. 2a-2c and 3, further illustrative embodiments of the present invention will now be described in more detail.

Figure 2A:
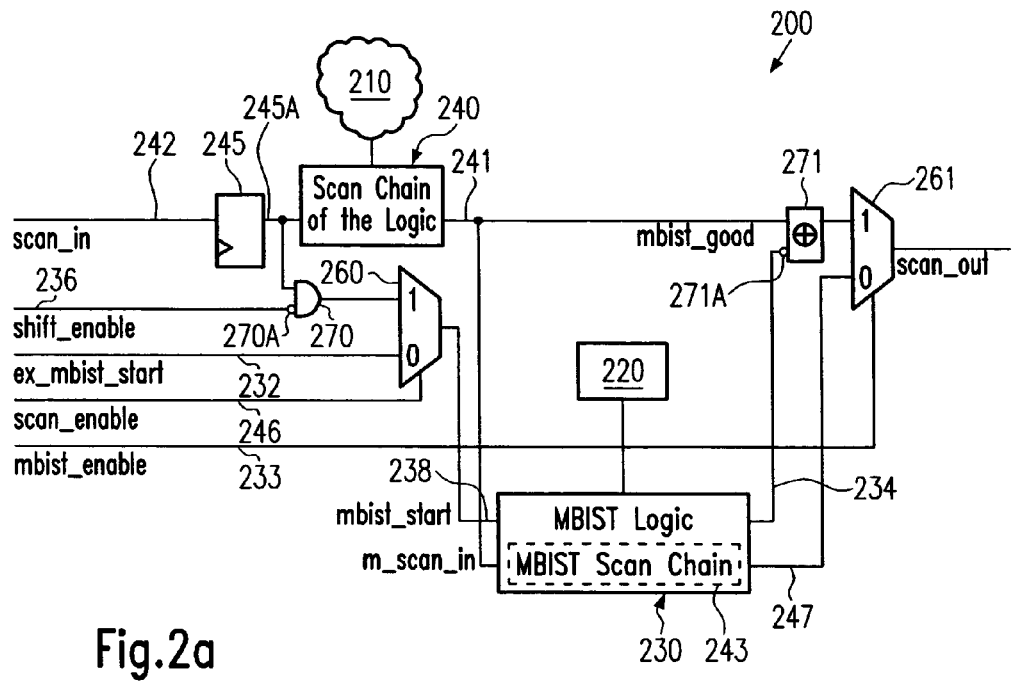
FIG. 2a schematically shows a semiconductor device including a scan chain and an MBIST logic that may be operated simultaneously in accordance with illustrative embodiments of the present invention.

FIG. 2a schematically shows a circuit diagram illustrating a semiconductor device 200 in accordance with illustrative embodiments of the present invention. The semiconductor device 200 comprises a memory portion 220 that is connected to an MBIST logic 230, which, in turn, includes at least one control input 238 that is, in the embodiment shown, provided in the form of a start input (MBIST-start) and configured to start the MBIST logic 230 and thus activate the memory self test mode. As previously discussed, it may be advantageous to provide scan flip-flops for the MBIST logic 230 and, therefore, in some embodiments, a scan chain 243 connected to the MBIST logic 230 is included to provide the potential for including the MBIST logic 230 into the scan test. The device 200 further comprises a logic circuitry portion 210 connected to a scan chain 240, which includes a scan input 242 and a scan output 241. The scan chain 240 further comprises at least one scan flip-flop 245, an output 245a of which is connected to enable the controlling of the at least one control input 238 of the MBIST logic 230 on the basis of the state of the output 245a.

In the particular embodiment shown in FIG. 2a, the flip-flop 245 is provided as a separate flip-flop that is not connected to the logic circuitry portion 210 to ensure that the output state of the flip-flop 245 may be selected and maintained without being affected by the state of the logic circuitry portion 210. In other embodiments, it may be considered appropriate to select one or more flip-flops of the scan chain 240 that are connected to the logic circuitry portion 210, and to provide a corresponding connection for the selected one or more flip-flops, possibly via additional logic gates and components, to allow the control of the control input 238. Hence, in such a configuration, the flip-flop 245 may be omitted. It should be noted, however, that in such a case the controllability of the control input 238 depends on the logic circuitry portion 210, as the flip-flops of the scan chain 240 store the state of the corresponding logic components that the scan flip-flops are associated with, so that the control of the MBIST logic 230, for instance, the starting and the stopping, is affected by the logic 210, thereby requiring that this effect be taken into consideration when designing appropriate scan test patterns.

In one particular embodiment as shown, the flip-flop 245 is provided in front of the remaining scan flip-flops connected to logic 210, whereas, in other embodiments, the flip-flop 245 may be arranged within the scan chain 240 to be preceded by one or more other flip-flops that are connected to the logic 210.

The semiconductor device 200 further comprises an input line 236, also indicated as shift-enable, which, when set, prepares the semiconductor device 200 for shifting a series of specified bits, i.e., an input vector, into the scan chain 240 and, if provided, into the scan chain 243. A further input line 232, also indicated as EX-MBIST-start is provided and is connected via a first multiplexer 260 with the control input 238. An input line 246, also indicated as scan-enable, is connected to a control input of the multiplexer 260. Moreover, an input line 233, also indicated as MBIST-enable, is connected to a control input of a second multiplexer 261, a first input of which is connected to an output of the scan chain 243. Furthermore, a first logic gate 270 is connected with one input to the output 245a of the flip-flop 245 and with a second input to an inverter 270a, which in turn is coupled to the shift enable input 236. The first logic gate 270 is provided as an AND-gate to provide a logic "1" to the first multiplexer 260 only when the flip-flop 245 is set and the shift-enable input 236 carries a logic "0."

The semiconductor device 200 further comprises a second logic gate 271, in the present embodiment configured as an exclusive OR gate with an inverter 271a, which is connected to an output 234, also indicated as MBIST-good, of the MBIST logic 230. Another input of the second logic gate 271 is connected to the output 241 of the scan chain 240. An output of the second logic gate 271 is connected to the second multiplexer 261, the other input of which is connected to the scan output 247 of the MBIST scan chain 243.

During operation of the device 200 in the scan test, the scan-enable input 246 is set high to activate all scan logic in the device 200. Moreover, the shift-enable input line 236 may be set to prepare the scan chain 240 and the MBIST scan chain 243 for shifting in an appropriate input vector, i.e., an appropriate bit pattern required for initiating the logic circuitry portion 210 and, if desired, the MBIST logic 230 during a scan test. According to the present invention, the input vector includes at least one dedicated control bit to set or reset the output 245a of the flip-flop 245. In one particular embodiment, the flip-flop 245 is arranged in front of the further flip-flops of the scan chain 240 that are connected to the logic circuitry 210. Depending on the design specifics, in other embodiments, it may be appropriate to arrange the flip-flop 245 at any location that is deemed advantageous in terms of design modification, chip space utilization, etc. As previously discussed, in some embodiments, the flip-flop 245 may also be connected to a dedicated component of the logic circuitry 210, that is, it may also serve as a scan flip-flop storing the state of a component of the logic 210 connected therewith. In this case, the selected scan test algorithm and input vectors have to be correspondingly adapted to any changes in the output 245a caused by a change of state of the dedicated component of the circuitry 210. For example, during a scan test sequence during which no change of the logic component connected to the flip-flop 245 is expected, the output 245a may therefore efficiently control the MBIST logic 230. Similarly, a plurality of flip-flops of the scan chain 240 may be connected to the control input 238 according to a desired logic function, for example an AND function, to control the logic 230 on the basis of a bit pattern of the flip-flops connected to the logic 210 and the input 238. In this way, a change of individual flip-flops may occur and may not affect the state of the control input as long as the bit pattern as a whole after passing the wired logic function does not change.

In the following it is, however, assumed that the flip-flop 245 may be operated independently from the logic 210. After setting the shift-enable input line 236, the first logic gate 270 ensures that, irrespective of the state of the output 245a, a logic "0" is supplied to the first multiplexer 260, while the scan-enable input line 246 is still at logic high, thereby resetting the control input 238, which in the present example results in stopping the MBIST logic 230. Thereafter, an appropriate number of shift clock signals (not shown) may be applied to the scan chain 240 and possibly to the MBIST scan chain 243 to enter the preselected input vector including the control bit for the flip-flop 245. After the input vector is shifted into the scan chain 240, 243, the scan mode may be enabled by setting the scan-enable input line 246 and by disabling the shift-enable input 236. Depending on the value of the control bit stored at the output 245a, the MBIST logic 230 may remain inactive when a logic "0" is at the output 245a, or the MBIST logic 230 may be activated when the flip-flop 245 stores a logic "1." Consequently, during the scan mode, the flip-flop 245 may control the MBIST logic 230. In case the MBIST logic 230 is activated, a memory test may be run, as is previously described, while at the same time the logic circuitry portion 210 may be operated in accordance with scan-clock signals (not shown) to store corresponding states of the logic 210 within the scan chain 240.

When the scan test and the memory self test are enabled and the memory self test is activated by the state of the flip-flop 245, a corresponding output signal at the output MBIST-good 234 may indicate the occurrence of a faulty memory cell. For instance, the MBIST-good output 234 may remain at a logic "1" as long as no error is detected and may be set to logic "0" upon the detection of a faulty memory cell. In this case, the second logic gate 271, i.e., the exclusive OR gate, modifies values provided at the output 241 during capturing values from the circuit portion 210 in the scan chain 240 and during shifting out the states of the scan chain 240. Hence, all bits provided by the scan chain 240 during operation, for instance a shift operation, during which the MBIST logic is stopped by the shift-enable input 236, or a capture operation of the scan chain 240, are inverted and hence may provide an indication for an error in the memory portion 220. If the starting point of the memory self test and the algorithm implemented in the MBIST logic 230 are known, the memory cell producing the first error, i.e., causing the inversion of the bit sequence provided by the scan chain 240, may be determined. Additionally, a single scan test run or a single MBIST run may be performed to confirm the fault diagnosis indicated by the modification of the output signal of the scan chain 240 during the simultaneous operation of the scan test and the memory self test. It should be noted that even if the fault diagnosis provided by modifying the output signal of the scan chain 240 may not be considered as to allow a 100% detection of faults (100% fault detection as is in principle obtainable by means of the scan chain 240) in the logic 210 and the memory portion 220, at least a strong indication is obtained to locate any errors in the logic 210 and the memory portion 220, thereby significantly saving on test time compared to a conventional approach requiring a subsequent operation of the scan test and the memory test.

In case the scan mode is disabled by resetting the scan-enable input 246, the MBIST logic 230 may be activated by the EX-MBIST-start input 232, since the first multiplexer 260 connects the input 232 to the control input 238. A corresponding fault in the memory portion 220 is then detectable at the output of the second multiplexer 261, since the exclusive OR gate 271 changes its output state in this case.

In a further operation mode, the scan test may be enabled and the MBIST logic 230 may be disabled, for instance by appropriately setting the flip-flop 245, so that the MBIST scan chain 243 is connected to the scan chain 240, thereby enabling the testing of the MBIST logic 230, wherein corresponding input vectors and scan test algorithms may be selected that allow an efficient test of the MBIST logic 230.

As previously discussed, it is frequently desirable to perform device testing under specified stress conditions, such as elevated temperatures and other sophisticated environmental conditions including, in particular, conditions for causing an accelerated aging of the device, such as increased supply voltage possibly in combination with elevated temperatures, increased levels of radiation and the like, wherein an increased switching activity in the logic is required, while frequently data are written in and read out from the memory portion 220. For example, the device 200 may comprise a large number of fast switching transistor elements that may influence the memory cells in the memory portion 220, especially when exposed to certain environmental conditions, such as increased levels of radiation and the like. Hence, the present invention enables an efficient test under sophisticated environmental conditions, if desired, since the simultaneous operation of the scan test and the memory test provides the required high switching activity while at the same time any errors or at least an indication thereof in the logic and the memory portion may be detected.

Figure 2B:
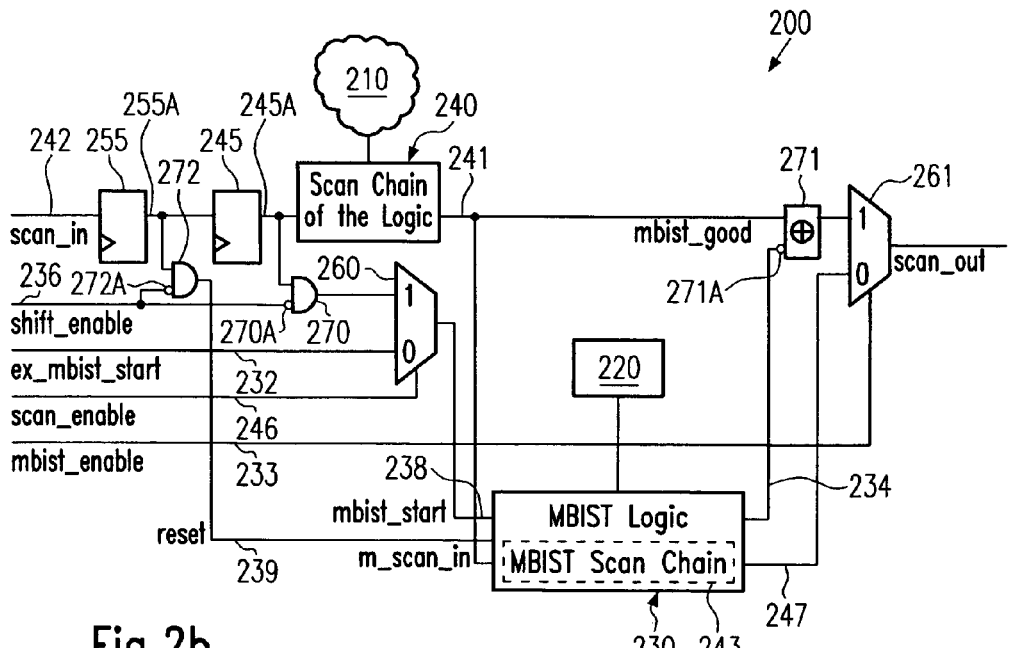
FIGS. 2b and 2c schematically show circuit diagrams illustrating a semiconductor device having additional flip-flops to control two or more control inputs of an MBIST logic and a semiconductor including a plurality of MBIST logics associated to a single scan chain, respectively.

FIG. 2b schematically shows a circuit diagram of a further illustrative embodiment, in which the device 200 comprises the MBIST logic 230 having a further control input 239, which is depicted as a reset input. The device 200 comprises at least one further flip-flop 255, an output 255a of which is connected to the reset input 239 via a further logic gate 272, a second input of which is coupled to the shift-enable input 236 via an inverter 272a.

Thus, during shifting in an input vector into the scan chain 240, the input vector may be selected to have a further control bit corresponding to the further flip-flop 255 so that, during the scan test mode, the control input 239 may be controlled by the output 255a of the flip-flop 255. Consequently, by dedicating the flip-flop 255 to the control of the control input 239, a higher degree of flexibility in performing the memory test is achieved. Concerning the other modes of operation as well as the configuration and location of the additional flip-flop 255, the same criteria apply as previously pointed out with reference to the flip-flop 245. It may also be readily appreciated that more than two flip-flops may be provided within the scan chain 240 if the MBIST logic 230 comprises more than two control inputs that need to be controlled during the scan test mode.

Figure 2C:
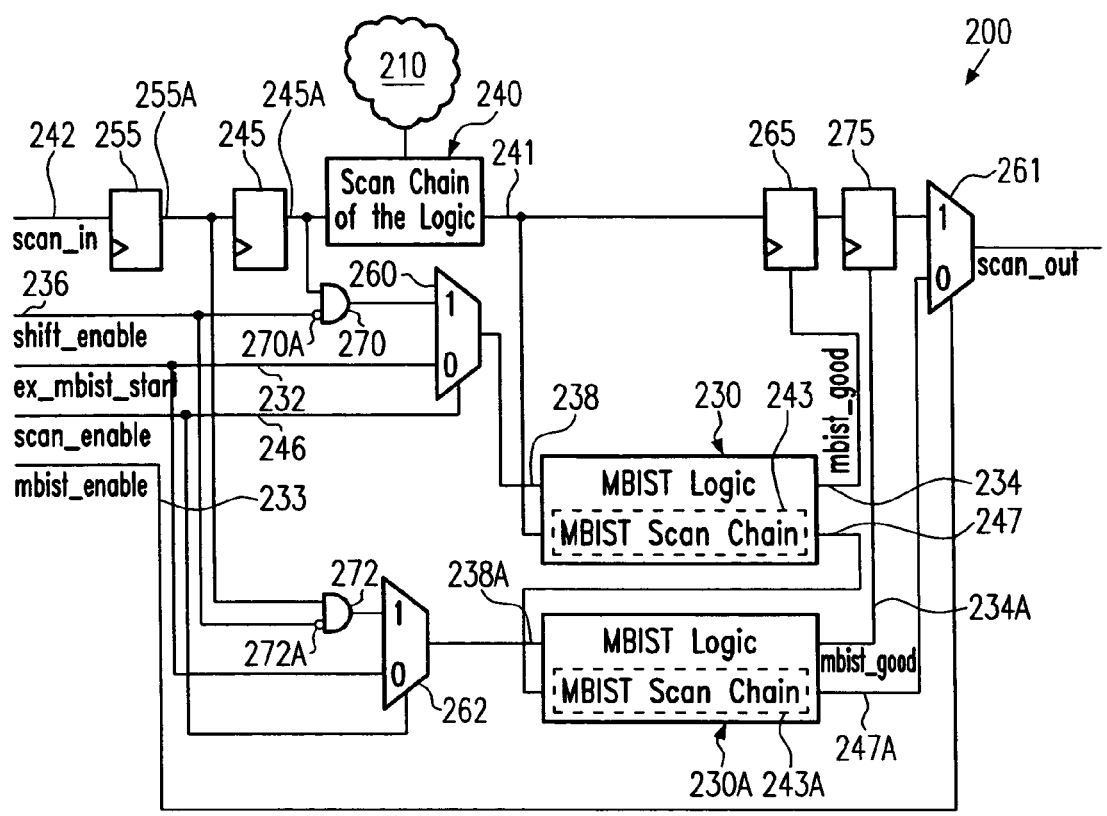

FIG. 2c schematically shows a further illustrative embodiment, wherein the flip-flops 245 and 255 are connected to control the MBIST logic 230 and a second MBIST logic 230a, which may be connected to a corresponding memory portion (not shown), respectively. Furthermore, a third multiplexer 262 may be provided similarly to the first multiplexer 260, which is connected to a control input 238a of the second MBIST logic 230a. Consequently, when in the scan test mode, starting and stopping of the MBIST logic 230, 230a may be controlled by the flip-flops 255 and 245. In other embodiments, the second MBIST logic 230a may be connected to the flip-flop 245, thereby enabling the control of the MBIST logics 230, 230a with a single bit. In this case, the flip-flop 255 may be omitted or may be dedicated to another control input in one of the MBIST logics 230, 230a.

As shown, the scan chain 243 may be connected with its output 247 with a scan chain 243a, an output 247a of which is connected to the multiplexer 261. In some embodiments, the MBIST-good output 234a of the MBIST logic 230a may be combined and may be connected to the logic gate 271, as is shown, for instance, in FIG. 2a for the output 234. Hence, the output 234 and 234a are combined by an AND function, which may reduce error tracking capabilities to a certain degree when a scan test and a memory test are performed simultaneously.

In the embodiment shown in FIG. 2c, the scan chain 240 may comprise an additional flip-flop 265 connected to the MBIST-good output 234 and a flip-flop 275 connected to the MBIST-good output 234a. Thus, during simultaneous operation of a scan test and of a memory test of the MBIST logic 230 and/or the MBIST logic 230a, the corresponding output state of the output 234 and/or 234a is stored in the flip-flop 265 and 275. Hence, upon shifting out the bits of the scan chain 240, the bits representing the flip-flops 265, 275 convey the information on whether there was an error encountered during the operation of the MBIST logic 234 and/or of the logic 234a. In case an error in one or both memory portions is detected and indicated via the flip-flops 265 and 275, a separate memory test run may then be performed. In other embodiments, the outputs 234 and 234a may be AND-combined and may be input to an exclusive OR gate together with the output of the scan chain 240, as is, for instance, shown in FIGS. 2a and 2b for the single MBIST-good output 234, so that based on the occurrence of an inversion of the values shifted out from the scan chain 240 and on the basis of the knowledge of the start of the respective memory tests and the algorithms used therein, additional information on any faulty memory cells may be gathered.

It should be appreciated that more than two memory portions having respective MBIST logics may be controlled by providing a corresponding number of flip-flops, wherein, if required, one or more of the MBIST logics may require two or more flip-flops in the scan chain 240 for enhanced process control. For instance, two flip-flops for a single MBIST logic may be provided if, for instance, the control of the start and the reset of the MBIST logic is desired.

In other embodiments, a plurality of scan chains and a plurality of memory portions may be provided, wherein at least some of the memory portions may be assigned to the scan chains in such a way that a one-by-one relation is established, so that a configuration as shown in FIG. 2a may be realized for each pair of scan chain and MBIST logic. Additionally, some of the plurality of the remaining MBIST logics may be assigned to a single scan chain, thereby resulting in a configuration similar to that shown in FIG. 2c. In any case, by only a small modification of the respective scan chains, a combination of one or more scan chains with one or more MBIST logics may be achieved in which a simultaneous operation of a scan test and a memory self test may be carried out. Advantageously, the algorithm of the memory self test and/or the input vectors and/or the scan algorithm may be adapted in a way that the memory test is finished prior to disabling the scan test mode. In this way, a detection or indication of faulty memory cells with high reliability is ensured for all of the memory cells.

Figure 1B:
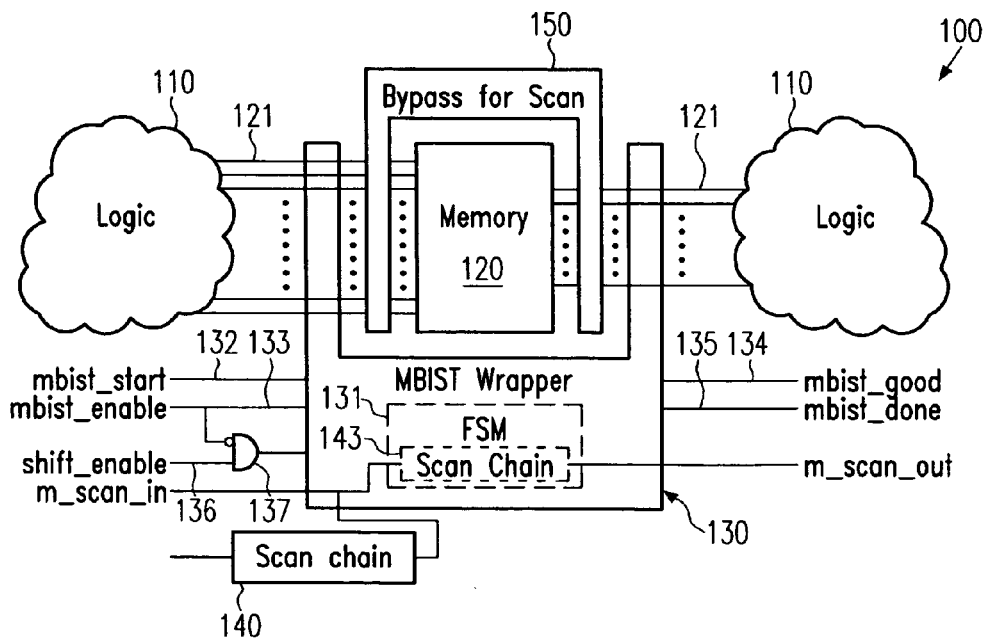
Figure 3:
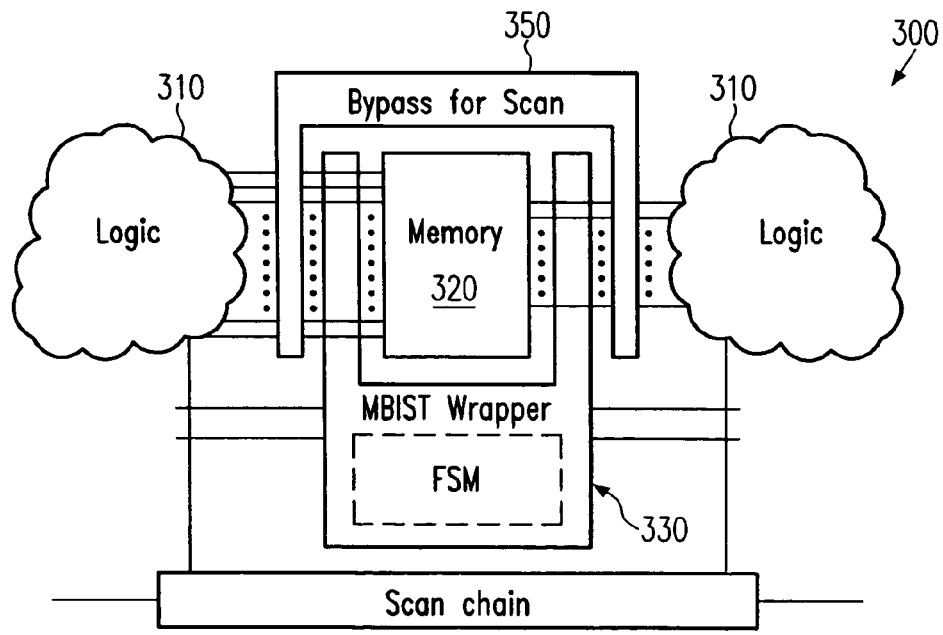
FIG. 3 schematically illustrates a semiconductor device having an embedded memory portion and a scan bypass logic for simultaneously performing a scan test and a memory test in accordance with further illustrative embodiments of the present invention.

FIG. 3 schematically shows a semiconductor device 300 comprising a logic circuitry 310, a memory portion 320, an MBIST logic 330 connected to the memory portion 320 and a scan bypass logic 350. The configuration of the device 300 is similar to that of the device 100 as shown in FIG. 1b, wherein, however, the bypass logic 350 is reconfigured to allow a simultaneous operation of the logic 310 and the MBIST logic 330 based on the concept as is described with reference to FIGS. 2a-2c. That is, the logic circuitry 310 and the bypass logic 350 may be associated to a respective scan chain, such as, for instance, the scan chain 240 shown in FIGS. 2a-2c, whereas the MBIST logic 330 may be associated with a respective scan chain, which may be connected to the logic scan chain in the same manner as previously discussed. Thus, during simultaneous operation of a scan test and a memory test, the bypass logic 350 may circumvent the memory portion 320 and simulate a proper "behavior" of the memory 320, while actually decoupling the memory portion 320 from the logic 310. At the same time, the MBIST logic 330 may run a memory self test as previously described.

In a further embodiment (not shown), the present invention may be applied to circuit configuration as is shown in FIG. 1b, wherein, however, the bypass logic 150 and/or the MBIST logic 130 may be modified in such a manner that the bypass logic 150 is "transparent" for data and signals provided by the MBIST logic 130 during a simultaneous scan test and MBIST. If a part of the logic 110 at the right side of FIG. 1b is also connected to a corresponding scan chain, any bits assigned to this part of the logic 110 may be excluded from assessing the scan test as these bits are determined by the MBIST logic 130.

As a result, the present invention provides a new approach that enables running a scan test and an MBIST in parallel. To this end, only minor changes of conventional approaches are required so that ATPG tools may be able to generate appropriate scan test patterns. Thus, only minimal modifications are necessary in establishing a set of scan test vectors to simultaneously begin the MBIST during a scan test execution. For this purpose, in some embodiments, one bit may be sufficient for each MBIST logic or a single bit may be set to enable MBIST for a plurality of memory portions in parallel. Furthermore, the MBIST logic may be disabled, and in addition a short scan test may be run that is essentially focused on faults concerning the MBIST logic, thereby enhancing the reliability of test results when both tests are performed at the same time. Due to the possibility of running scan tests and memory tests at least partially simultaneously, the test time and thus production costs may be significantly reduced compared to conventional approaches requiring separate runs for the scan test and the MBIST. In addition, the efficiency of stress tests is significantly increased by simultaneously running scan tests and MBIST, since a high switching activity is achieved in the functional logic while data is written to each memory cell and is read back again. Moreover, additional input or output lines may be avoided and in many cases the length of the scan chain may increase by only one flip-flop or scan flip-flops may additionally be wired to provide the control function, thereby requiring only a small additional area on the chip while nevertheless supporting fault diagnosis.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a memory portion;
a memory built-in self test (MBIST) logic connected to said memory portion, said MBIST logic including a first control input for controlling a memory self test mode;
a logic circuitry portion; and
a first scan chain connected to said logic circuitry portion and configured to test said logic circuitry, said scan chain comprising a plurality of sequentially arranged flip-flops, a scan input and a scan output, an output of at least one of the plurality of flip-flops being connected to set said first control input of said MBIST logic.

2. The semiconductor device of claim 1, wherein said first control input represents a start input for activating the memory self test.

3. The semiconductor device of claim 1, further comprising a shift-enable input configured to enable shifting an input vector into said first scan chain, said shift-enable input connected to set said start input of said MBIST logic.

4. The semiconductor device of claim 3, further comprising a first combinatorial logic connected with a first input to said output of the at least one flip-flop, and connected with a second input to said shift-enable input, an output of said first combinatorial logic connected to enable setting of said first control input when said shift-enable input indicates disabling of shifting and said output of said at least one flip-flop indicates enabling of said memory self test mode.

5. The semiconductor device of claim 4, further comprising a second combinatorial logic connected with a first input to said output of the first scan chain and connected with a second input to an output of said MBIST logic, said second combinatorial logic configured to invert an output signal of said first scan chain when an output signal of said MBIST logic indicates a fault of said memory.

6. The semiconductor device of claim 1, further comprising a second scan chain connected to said MBIST logic and having a second scan input and a second scan output, said second scan input connected to said scan output of the first scan chain.

7. The semiconductor device of claim 6 or 4, further comprising a scan-enable input connected to a control input of a first multiplexer, a first input of said first multiplexer being connected to an output of said first combinatorial logic, a second input of said first multiplexer being connected to receive a signal for setting said first control input of the MBIST logic, and an output of said first multiplexer being connected to said first control input.

8. The semiconductor device of claim 7, further comprising an MBIST-enable input connected to a control input of a second multiplexer, a first input of the second multiplexer being connected to at least one of an output of the MBIST logic and the output of the scan chain, a second input of the second multiplexer being connected to the output of the second scan chain, and an output of the second multiplexer being accessible by an external device.

9. The semiconductor device of claim 1, wherein said at least one flip-flop is directly connected to said scan input to receive an input vector serially provided at said scan input.

10. The semiconductor device of claim 1, further comprising a second control input for said MBIST logic.

11. The semiconductor device of claim 10, wherein a first one of said at least one flip-flop is connected with its output to the first control input of the MBIST logic and wherein a second one of said at least one flip-flop is connected to said second control input.

12. The semiconductor device of claim 1, further comprising a second memory portion connected to a second MBIST logic, wherein at least one further flip-flop of said plurality of flip-flops is connected with its output to a control input of said second MBIST logic.

13. The semiconductor device of claim 12, wherein at least one of said plurality of flip-flops is connected with its input to an output of said second MBIST logic.

14. The semiconductor device of claim 1, further comprising a second memory portion connected to a second MBIST logic, wherein said at least one flip-flop of said plurality of flip-flops is connected with its output to a control input of said second MBIST logic.

15. The semiconductor device of claim 1, further comprising a second memory portion connected to a second MBIST logic, a second logic circuitry connected to a second scan chain, wherein an output of at least one flip-flop of the second scan chain is connected to a control input of the second MBIST logic.

16. A method, comprising:
  shifting an input vector into a scan chain connected to a logic circuitry portion and configured to test said logic circuitry, said input vector having at least one control bit for an associated flip-flop of said scan chain; and
  controlling a memory built-in self test (MBIST) of a MBIST logic that is connected to a memory portion on the basis of said control bit.

17. The method of claim 16, wherein controlling said MBIST comprises staffing said MBIST.

18. The method of claim 17, further comprising controlling the starting of the MBIST on the basis of a shift-enable signal, said shift-enable signal controlling the shifting of an input vector into said scan chain.

19. The method of claim 18, further comprising combining an output signal of said MBIST logic that indicates a faulty state of the memory portion with an output signal of said scan chain to modify said output signal of the scan chain upon occurrence of a faulty state indication in said output signal of the MBIST logic.

20. The method of claim 19, wherein modifying said output signal of said scan chain comprises inverting said output signal of the scan chain.

21. The method of claim 19, further comprising indicating an error in said memory portion when after occurrence of a first inverted bit of said output signal at least a plurality of inverted bits follow subsequent to said first inverted bit.

22. The method of claim 21, further comprising monitoring starting and processing of said MBIST logic to identify a faulty memory cell after occurrence of said first inverted bit and said plurality of subsequent inverted bits of said output signal of the scan chain.

23. The method of claim 19, wherein said output signal of the scan chain is modified by an exclusive OR-function wherein a second input of the exclusive OR-function is the output signal of said MBIST logic.

24. The method of claim 16, further comprising providing a second control bit in said input vector and a second associated flip-flop in said scan chain, an output of said second associated flip-flop being connected to control a second control input of said MBIST logic.

25. The method of claim 16, further comprising providing an MBIST scan chain connected to said MBIST logic, wherein an input of the MBIST scan chain is connected to an output of said scan chain.

26. The method of claim 25, further comprising shifting an input vector into said MBIST scan chain via said scan chain while disabling the starting of said MBIST logic.

27. The method of claim 26, further comprising testing at least one of the logic circuitry portion and the memory portion on the basis of the signal output by the MBIST scan chain.

28. The method of claim 16, further comprising providing a second memory portion connected to a second MBIST logic and providing a second control bit associated to a second flip-flop, an output of said second associated flip-flop connected to control the second MBIST logic.

29. The method of claim 28, further comprising combining said output signal of the scan chain with the output signal of the MBIST logic and the output signal of the second MBIST logic to assess the state of at least one of the logic circuitry portion, the memory portion and the second memory portion.

30. The method of claim 29, wherein a state of the output signal of the MBIST logic and the state of the output signal of the second MBIST logic are each stored in respective flip-flops in said scan chain.

31. The method of claim 16, further comprising:
  providing a second scan chain connected to a second logic circuitry portion;
  providing a second memory portion connected to a second MBIST logic; and
  controlling the second MBIST logic on the basis of a second control bit of a second input vector to be shifted into said second scan chain.

32. The method of claim 31, further comprising combining an output signal of said second scan chain and an output signal of said second MBIST logic to modify said output signal of the second scan chain upon occurrence of a faulty state indication in said output signal of the second MBIST logic.

33. The method of claim 16, further comprising adapting at least one of a scan test pattern and an MBIST algorithm to finish an MBIST prior to finishing a scan test run when said logic circuitry portion and said memory portion are tested simultaneously.

34. The method of claim 16, further comprising disabling a shift mode after shifting said input vector into said scan chain, wherein said control bit is selected to start said MBIST after receipt of a scan-enable signal, providing said scan-enable signal to simultaneously run a scan test and the MBIST to obtain a high switching activity in the logic circuitry portion while writing and reading data to and from said memory portion.

35. The method of claim 34, further comprising exposing said logic circuitry portion and said memory portion to a predefined stress condition.

* * * * *

UNITED STATES PATENT AND TRADEMARK OFFICE
CERTIFICATE OF CORRECTION

PATENT NO. : 7,340,658 B2 Page 1 of 1
APPLICATION NO. : 11/008877
DATED : March 4, 2008
INVENTOR(S) : Markus Seuring It is certified that error appears in the above-identified patent and that said Letters Patent is hereby corrected as shown below:

In column 13, claim 17, line 45, delete "staffing" and insert -- starting --.

Signed and Sealed this

Seventeenth Day of June, 2008

JON W. DUDAS
*Director of the United States Patent and Trademark Office*